(12) United States Patent
Trethan et al.

(10) Patent No.: US 11,733,270 B2
(45) Date of Patent: Aug. 22, 2023

(54) SIGNAL-PROCESSING CIRCUIT

(71) Applicant: EGSTON SYSTEM ELECTRONICS EGGENBURG GMBH, Eggenburg (AT)

(72) Inventors: Stefan Trethan, Ravelsbach (AT); Roman Jamy, Neupolla (AT)

(73) Assignee: EGSTON SYSTEM ELECTRONICS EGGENBURG GMBH, Eggenburg (AT)

( * ) Notice: Subject to any disclaimer, the term of this patent is extended or adjusted under 35 U.S.C. 154(b) by 322 days.

(21) Appl. No.: 17/291,999

(22) PCT Filed: Nov. 7, 2019

(86) PCT No.: PCT/EP2019/080596
§ 371 (c)(1),
(2) Date: May 6, 2021

(87) PCT Pub. No.: WO2020/094811
PCT Pub. Date: May 14, 2020

(65) Prior Publication Data
US 2022/0011349 A1 Jan. 13, 2022

(30) Foreign Application Priority Data
Nov. 9, 2018 (AT) ............... A 50966/2018

(51) Int. Cl.
*G01R 15/18* (2006.01)
*G01R 19/00* (2006.01)
(52) U.S. Cl.
CPC ....... *G01R 15/181* (2013.01); *G01R 19/0046* (2013.01)

(58) Field of Classification Search
CPC ... G01R 15/181; G01R 19/0046; G01R 19/00
(Continued)

(56) References Cited

U.S. PATENT DOCUMENTS 6,614,218 B1 * 9/2003 Ray ...................... G01R 15/181
324/117 R

FOREIGN PATENT DOCUMENTS

CN 108736852 A * 11/2018
DE 102018201310 A1 10/2018
(Continued)

OTHER PUBLICATIONS

J.A.J. Pettinga et al., "A polyphase 500 kA current measuring system with Rogowski coils," IEE Proceedings, Sep. 1983, vol. 130, Pt. B, No. 5, pp. 360-363.
(Continued)

*Primary Examiner* — Tung X Nguyen
*Assistant Examiner* — Robert P Alejnikov, Jr.
(74) *Attorney, Agent, or Firm* — CKC & Partners Co., LLC

(57) ABSTRACT

The invention relates to a signal-processing circuit (1), comprising at least one signal path (2) between an input (3) and an output (4) of the signal-processing circuit (1), wherein: the signal path (2) has a first passive integrating element (5) and an active integrator (6); the active integrator (6) is designed as a non-inverting active integrator (6); the first passive integrating element (5) and the active integrator (6) are connected in series within the signal path (2). According to the invention, the signal path (2) additionally has a second passive integrating element (7) and a differentiating element (20).

11 Claims, 1 Drawing Sheet

(58) Field of Classification Search
USPC .......................................................... 324/72
See application file for complete search history.

(56) References Cited

FOREIGN PATENT DOCUMENTS

EP          2810088 A1 * 12/2014   ........... G01R 15/181
EP          2810088 A1    12/2014

OTHER PUBLICATIONS

Peerawut Yutthagowith et al., "A Rogowski Coil with an Active Integrator for Measurement of Long Duration Impulse Currents," 2014 International Conference on Lightning Protection (ICLP), IEEE, Oct. 11, 2014, pp. 1761-1765.

* cited by examiner

SIGNAL-PROCESSING CIRCUIT

RELATED APPLICATIONS

This application is the U.S. national phase under § 371 of International Application No. PCT/EP2019/080596 filed Nov. 7, 2019, which claims priority from Austria Patent Application Serial Number A 50966/2018, filed Nov. 9, 2018, the entire contents of each of which are incorporated by reference.

BACKGROUND

Field of Invention

The invention relates to a signal-processing circuit according to the preamble of claim 1.

Description of Related Art

It is known to use coils as sensors for current measuring. Especially air core coils or so called Rogowski coils have proven to be advantageous. A Rogowski coil outputs the differential of the measured current as voltage. It is therefore necessary to process such a measurement signal by means of a subsequent integration.

Both active and passive circuits for integrating a signal are known. Furthermore, it is known to combine an active integrator and a passive integrating element for the detection or measurement of currents with high dynamics. It has been shown that the use of the widely known inverting integrator-operating amplifier circuit for forming the active integrator has considerable disadvantages when signals with a large voltage swing are applied to the input of such a circuit.

Signal-processing circuits combining a passive integrating element with an active integrator are known from U.S. Pat. No. 6,614,218 B1 (Ray) and from the publication: Pettinga, et al., "A polyphase 500 kA current measuring system with Rogowski coils", wherein the active integrator is designed as a non-inverting integrator.

However, it has been shown that such signal-processing circuits still have considerable problems with regard to the achievable measurement accuracy if an input signal contains signal components with a very high edge steepness or slew rate, for example greater than 10 kA/µs. Such steep signal components can lead to an integration error at the active integrator, and thus cause considerable errors which make a measurement result completely unusable.

Such steeply rising signal components are contained in particular in lightning currents. As a result, real lightning currents or lightning currents actually occurring in nature could not be measured by means of Rogowski coils so far, since the known signal-processing circuits do not represent a lightning current sufficiently accurately or distort its spectral distribution as well as its dynamic time behavior. Therefore, real lightning currents are currently measured with very large, voluminous and costly shunt resistors, which have to withstand the power dissipation of a lightning. Due to the significant cost of such shunt resistors, systems for measuring real lightning are hardly common, and are primarily used for research purposes. It should be noted that due to their mass, dimensions and installation effort, such measuring systems are always permanently installed and cannot be used for mobile applications.

SUMMARY

A broadly effective application of lightning current measuring systems is not possible on the basis of shunt resistors. However, the use of lightning current measuring systems would be desirable, at least for exposed buildings such as wind turbines, from the point of view of both research and insurance. This would make it possible to correlate the damage caused by lightning with the currents that occur.

It is therefore the object of the invention to provide a signal-processing circuit of the type mentioned at the beginning, with which the disadvantages mentioned can be avoided, and with which currents with a large dynamic range as well as with sharply rising signals or high edge steepness can be measured by means of a current measuring coil.

According to the invention, this is achieved by the features of claim 1.

This means that currents with a wide dynamic range and signal components with a high edge steepness or a high slew rate, in particular greater than 10 kA/µs, can also be accurately detected and measured by means of a current measuring coil. This can prevent signal components with a high slew rate from causing faults at the active integrator. The second passive integrating element attenuates steep-edged signals significantly more than before, which means that the active integrator only has to process signals with a significantly lower slew rate or signal rise time. The effect of the second passive integrating element on the frequency response is compensated by the differentiating element.

As a result, even highly dynamic currents such as real lightning can be measured using Rogowski coils, which significantly reduces the effort required to measure lightning or lightning currents. As a result, significantly more exposed installations can be equipped with a lightning current measuring system. This can increase knowledge of the characteristics and effects of lightning. As a result, knowledge can be gained, the application of which can increase the safety of people and equipment against the effects of lightning strikes.

The subclaims relate to further advantageous designs of the invention.

Express reference is hereby made to the wording of the patent claims, whereby the claims are incorporated by reference into the description at this point and are deemed to be reproduced verbatim.

BRIEF DESCRIPTION OF THE DRAWINGS

The invention is described in more detail with reference to the enclosed drawings, in which only preferred embodiments are shown by way of example, wherein.

DETAILED DESCRIPTION

Figure 1:
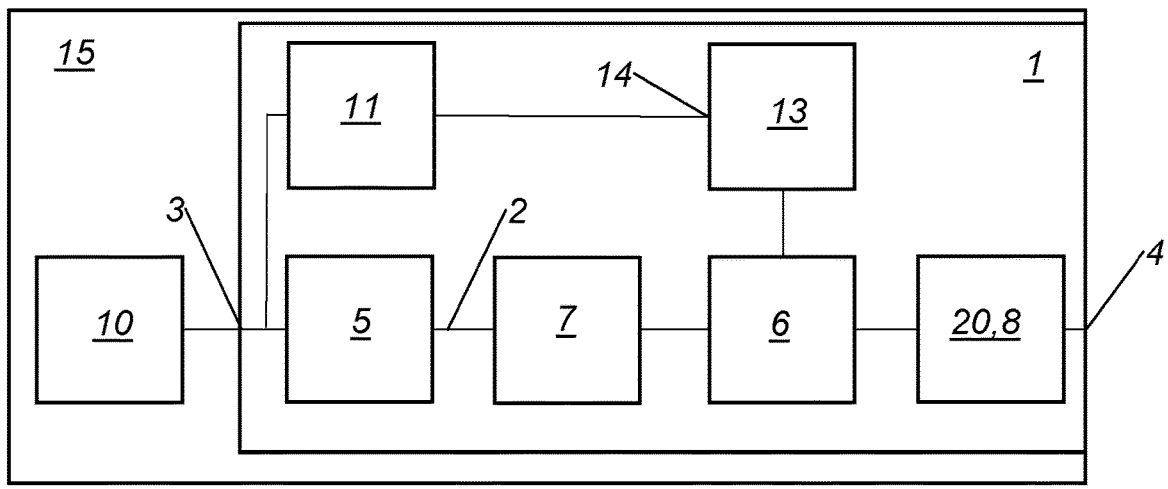
FIG. 1 shows a block diagram of a preferred embodiment of a current measuring system having a subject signal-processing circuit according to the subject matter.
Figure 3:
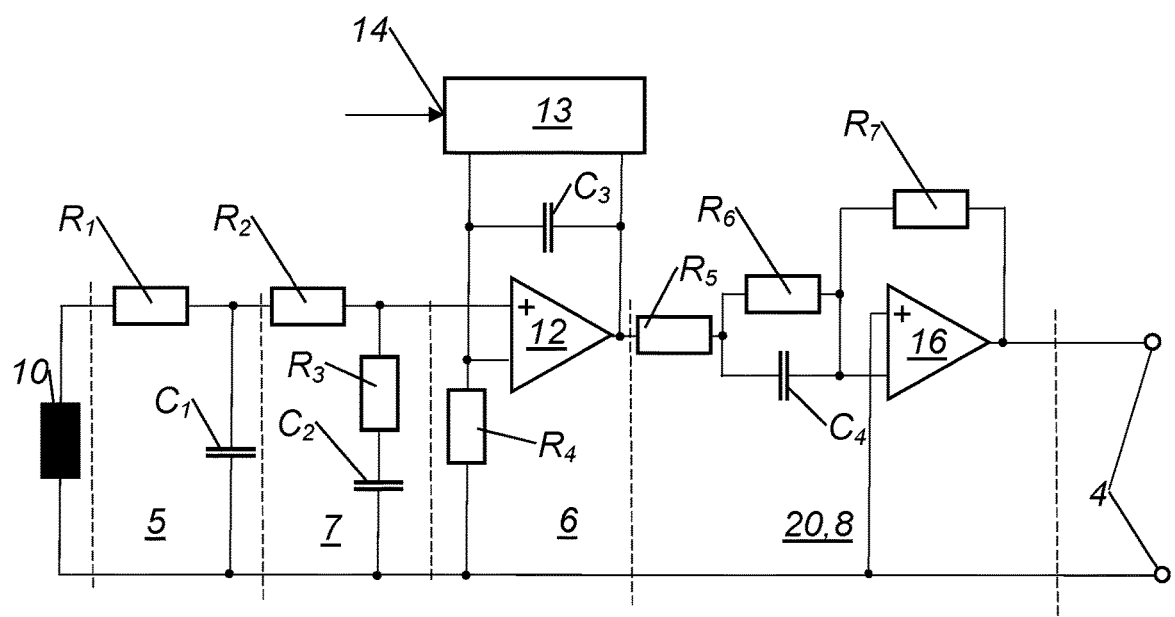
FIG. 3 shows a schematic circuit diagram of the current measuring system according to FIG. 1 without voltage monitoring unit.

FIGS. 1 and 3 each show a current measuring system 15 having a signal-processing circuit 1 with at least one signal path 2 between an input 3 and an output 4 of the signal-processing circuit 1, wherein the signal path 2 has a first passive integrating element 5 and an active integrator 6, wherein the active integrator 6 is designed as a non-inverting active integrator 6, wherein the first passive integrating element 5 and the active integrator 6 are connected in series within the signal path 2, wherein the signal path 2 further comprises a second passive integrating element 7 and a differentiating element 20.

This means that currents with a wide dynamic range and signal components with a high edge steepness or a high slew rate, in particular greater than 10 kA/µs, can also be accurately detected and measured by means of a current measuring coil 10. This can prevent signal components with a high slew rate from causing faults at the active integrator 6. The second passive integrating element 7 attenuates steep-edged signals much more than before, which means that the active integrator 6 only has to process signals with a much lower slew rate or signal rise time. The effect of the second passive integrating element 7 on the frequency response is compensated again by the differentiating element 20.

As a result, even highly dynamic currents such as real lightning can be measured using Rogowski coils, which significantly reduces the effort required to measure lightning or lightning currents. As a result, significantly more exposed installations can be equipped with a lightning current measuring system. This can increase knowledge of the characteristics and effects of lightning. As a result, knowledge can be gained, the application of which can increase the safety of people and equipment against the effects of lightning strikes.

A signal-processing circuit 1 according to the subject matter serves to integrate an input signal with a wide dynamic range over a wide frequency range. In particular, the signal-processing circuit 1 according to the subject matter is designed and intended to process measurement signals originating from a current measuring coil 10, which serves as a sensor. In particular, it is provided that this current measuring coil 10 is a Rogowski coil. However, any signal can be integrated with the signal processing circuit 1 according to the subject matter, regardless of its origin or of the type and configuration of the sensor which generated the signal in question or of a storage medium on which the signal is stored. It is understood that the signal in question must be within the maximum load limits for which a specific embodiment of the signal-processing circuit 1 is dimensioned. The signal-processing circuit 1 according to the subject matter is therefore preferably not limited to use in or as part of a current measuring system 15, in particular a lightning current measuring system.

The signal-processing circuit 1 has an input 3 and an output 4, as well as a signal path 2 between the input 3 and the output 4. Although the signal path 2 is shown with only a single line in the block diagram according to FIG. 1, the signal path 2—as shown in FIG. 3—preferably comprises a signal-carrying line 17, as well as further a reference potential line 18.

The input 3 is provided in particular for a current measuring coil 10 to be connected to it. In particular, it is provided that a specific signal-processing circuit 1 is designed for signal processing of the measurement signals of a specific current measuring coil 10. This is preferably provided in particular with regard to the consideration of the internal resistance $R_i$ of the current measuring coil 10 as well as its thermal behavior. Like any real passive component, the current measuring coil 10 has an internal resistance $R_i$. Current measuring coils 10, such as the preferably provided Rogowski coils, have a positive temperature coefficient. The signal-processing circuit 1 according to the subject matter is primarily intended to measure lightning currents. For this purpose, the current measuring coil 10 is fixedly arranged or installed at a specific point, such as a building or a wind turbine. The current measuring coil 10 is then exposed to fluctuations in the ambient temperature due to the weather. Since this usually leads to cooling or heating of the current measuring coil 10, it is preferably provided that the behavior of the current measuring coil 10 during heating is also taken into account.

Figure 2:
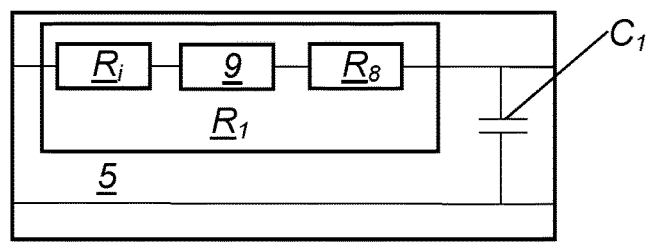
FIG. 2 shows a block diagram of a preferred embodiment of the first integrating element.

The signal path 2 has a first passive integrating element 5, which is preferably arranged as a first assembly after the input 3. This first passive integrating element 5 is preferably designed as a low-pass filter comprising a first resistor $R_1$. In the preferred design as a passive first-order low-pass filter, the first passive integrating element 5 further comprises only a first capacitor C1, as shown in FIGS. 2 and 3, and as known per se.

The first resistor $R_1$ is preferably formed by a series connection of several resistors. It is provided that the internal resistance $R_i$ of the current measuring coil 10 is part of the first resistor $R_i$. Furthermore, the first resistor $R_1$ preferably has a discrete fixed resistor $R_8$, which can also be referred to as the eighth resistor $R_8$ according to the subject matter.

In addition, it is particularly preferably provided that the signal-processing circuit 1 has a temperature compensation circuit 9 for compensating the temperature-dependent internal resistance $R_i$ of a predeterminable current measuring coil 10 which can be connected to the input. This temperature compensation circuit 9 is arranged in particular at the input 3, and particularly preferably, and as shown in FIG. 2, forms part of the first resistor $R_1$. The first resistor $R_1$ is arranged in the signal-carrying line 17.

The temperature compensation circuit 9 may in itself be designed as any type of circuit for compensating or equalizing the PTC behavior of the current measuring coil 10. Preferably, the temperature compensation circuit 9 comprises at least one NTC resistor. Particularly preferably, the temperature compensation circuit 9 is formed comprising a predeterminable number of interconnected NTC resistors.

The signal path 2 also comprises an active integrator 6, which is connected in series to the first passive integrating element 5 in the signal path 2. The active integrator 6 is designed as a non-inverting active integrator 6. The active integrator 6 preferably has at least one first operational amplifier 12. The signal-carrying line 17 is connected to the non-inverting input of the first operational amplifier 12. The inverting input of the operational amplifier 12 is connected to the reference potential 18 via the fourth resistor $R_4$. Further, the active integrator 6 has the feedback capacitor $C_3$ which connects the output of the first operational amplifier 12 to its inverting input. The feedback capacitor $C_3$ can also be referred to as the third capacitor $C_3$ according to the subject matter.

For particularly accurate functioning of the active integrator 6, it is important that the feedback capacitor $C_3$ is not charged, i.e. that the voltage across the feedback capacitor $C_3$ is zero at the start of a measurement. In the preferred application of the signal-processing circuit 1 according to the subject matter as part of a lightning current measuring system, it can be assumed that no measurement signals are to be processed over long periods of time. This may result in the feedback capacitor $C_3$ assuming an undefined charge state, which would lead to considerable falsification of the measurement results in the event of a measurement having to be carried out suddenly. It is therefore preferably provided that the signal-processing circuit 1 further comprises an active regulating unit 13 which is connected to the feedback capacitor $C_3$. This active regulating unit 13 is designed in such a way that it regulates the voltage across the feedback capacitor $C_3$ below a predeterminable value, in particular essentially to zero. The active regulating unit 13 can, for example, comprise a programmable controller or a microcontroller. The active regulating unit 13 can ensure that no distortions occur due to a charge of the feedback capacitor $C_3$ when a measurement signal is present.

The active regulating unit 13 is to be used only at times when no predeterminable measurement signal is present at the signal-processing circuit 1. It is therefore further preferably provided that the signal-processing circuit 1 has a voltage monitoring unit 11 which is connected to the input 3. The voltage monitoring unit 11, which is only shown schematically in FIG. 1, monitors the electrical voltage present at input 3 and is designed in such a way that it outputs a trigger signal when a predeterminable voltage occurs at input 3.

In this context, it is further preferably provided that the voltage monitoring unit 11 is connected to an operating input 14 of the regulating unit 13 in order to switch off the regulating unit 13 or take it out of operation as soon as a predeterminably large measurement signal is present at the input 3. The active regulating unit 13 is therefore designed together with the voltage monitoring unit 11 in such a way that the active regulating unit 13 switches off when the trigger signal is applied to the operating input 14.

With regard to the specific trigger signal, the voltage monitoring unit 11 and the active regulating unit 13 must be coordinated with each other.

It is provided that the signal path 2 further comprises a second passive integrating element 7 and a differentiating element 20. The second passive integrating element and the differentiating element 20 are arranged in terms of circuitry in series with the first passive integrating element 5 and the active integrator 6. In particular, it is provided that the differentiating element 20 is connected in series downstream of the active integrator 6, although an arrangement of the individual assemblies deviating from the arrangement according to FIGS. 1 and 3 can also be provided.

The differentiating element 20 may be designed as a passive differentiating element 20. However, it is particularly preferred, as shown in detail in FIG. 3, that the differentiating element 20 is designed as an active differentiator 8. In the following, the invention is described together with an active differentiator 8, although the use of a passive differentiating element 20 may also be provided in each case.

The signal-processing circuit 1 according to the subject matter has a first passive integrating element 5 and a second passive integrating element 7 as well as an active integrator 6 and an active differentiator 8 in its signal path 2. These four components 5, 6, 7, 8 are to be coordinated with each other in such a way that together they perform integration of a broadband input signal as seamlessly as possible. This is achieved in particular by the respective design with regard to the transfer frequencies.

The active integrator 6 is used to integrate the so-called slow signal components, i.e. signal components of an applied measurement signal with low frequencies or low slew rate. In particular, it is provided that the active integrator 6 is designed and dimensioned accordingly for integrating signal components of an input or measurement signal with a frequency between 0 Hz (DC or direct current) and a first cut-off frequency $f_{g1}$.

The first passive integrating element 5 is designed for the integration of signal components with a frequency above the first cut-off frequency $f_{g1}$, and is to be tuned or designed accordingly. The first passive integrating element (5) is therefore used for the integration of high-frequency or "fast" signal components and acts on the entire frequency range above the first cut-off frequency $f_{g1}$.

The second passive integrating element 7 is designed to integrate signal components of the input signal with a frequency which lies only between the first cut-off frequency $f_{g1}$ and a second cut-off frequency $f_{g2}$, wherein the second cut-off frequency $f_{g2}$ is greater than the first cut-off frequency $f_{g1}$. In this frequency range between the first cut-off frequency $f_{g1}$ and the second cut-off frequency $f_{g2}$, therefore, both the first passive integrating element 5 and the second passive integrating element 7 act on the corresponding signal components. In this way, as already explained, the function or accuracy of the active integrator 6 can be significantly increased by attenuating signals with very high slew rates.

The second passive integrating element 7 is designed in such a way that its effect is limited again at or from the second cut-off frequency $f_{g2}$. FIG. 3 shows a possible embodiment of the second passive integrating element 7, which in addition to the obligatory second resistor $R_2$ and the second capacitor $C_2$ also comprises the third resistor $R_3$, which is connected in series to the second capacitor $C_2$ and which limits the effect of the second capacitor $C_2$ at higher frequencies, so that the second passive integrating element 7 is no longer effective above the second cut-off frequency $f_{g2}$.

Preferably, it is provided that the second passive integrating element 7 is arranged in terms of circuitry between the first passive integrating element 5 and the active integrator 6.

The active differentiator 8 serves to compensate for the integrating effect of the second passive integrating element 7. The active differentiator 8 is therefore preferably designed to differentiate signal components of the input signal only between the first cut-off frequency $f_{g1}$ and the second cut-off frequency $f_{g2}$. Only the signal components in this frequency range are to be differentiated.

FIG. 3 shows a preferred implementation of an active differentiator 8 according to the subject matter. It comprises the second operational amplifier 16. The fifth resistor $R_5$ and the fourth capacitor $C_4$ are arranged between the active integrator 6 and the input of the second operational amplifier 16. The sixth resistor $R_6$, connected in parallel to the fourth capacitor $C_4$, ensures that the effect of the active differentiator 8 is limited to a specific frequency range, namely the range between the first cut-off frequency $f_{g1}$ and the second cut-off frequency $f_{g2}$. Furthermore, the seventh resistor $R_7$ connects the output of the second operational amplifier 16 to its inverting input or the fourth capacitor $C_4$.

In the actual implementation of the signal-processing circuit 1 according to the subject matter, special attention must be paid to the transitions at the respective cut-off frequencies. It is irrelevant whether the cut-off frequencies are specified according to the common definition as the frequency at which a signal has an attenuation of −3 dB, as long as the respective components are tuned to each other in order to achieve the smoothest possible transition or the most uniform integration possible.

It should also be noted that the measurement signal-carrying areas of the signal-processing circuit 1 according to the subject matter are designed in a fully analog manner. The complete signal path 2 is free of analog-to-digital converters or digital-to-analog converters. However, components away from the signal path 2, such as in particular the active regulating unit 13 may have digital parts. It has been shown that digital circuits are not suitable for the preferred application of lightning measurement.

The invention claimed is:

1. Signal-processing circuit (1) having at least one signal path (2) between an input (3) and an output (4) of the signal-processing circuit (1), wherein the signal path (2) comprises a first passive integrating element (5) and an active integrator (6), wherein the active integrator (6) is designed as a non-inverting active integrator (6), wherein the first passive integrating element (5) and the active integrator (6) are connected in series within the signal path (2), characterized in that the active integrator (6) is designed for integrating signal components of an input signal having a frequency between 0 Hz and a first cut-off frequency $f_{g1}$, and in that the first passive integrating element (5) is designed for integrating signal components having a frequency above the first cut-off frequency $f_{g1}$, in that the signal path (2) further comprises a second passive integrating element (7) and a differentiating element (20) and in that the second passive integrating element (7) is designed for integrating signal components of the input signal with a frequency which lies only between the first cut-off frequency $f_{g1}$ and a second cut-off frequency $f_{g2}$, wherein the second cut-off frequency $f_{g2}$ is greater than the first cut-off frequency $f_{g1}$.

2. Signal-processing circuit (1) according to claim 1, characterized in that the differentiating element (20) is designed to compensate for the integrating effect of the second passive integrating element (7).

3. Signal-processing circuit (1) according to claim 1, characterized in that the differentiating element (20) is designed for differentiating signal components of the input signal only between the first cut-off frequency $f_{g1}$ and the second cut-off frequency $f_{g2}$.

4. Signal-processing circuit (1) according to claim 1, characterized in that the differentiating element (20) is connected in series downstream of the active integrator (6).

5. Signal-processing circuit (1) according to claim 1, characterized in that a temperature compensation circuit (9) for compensating a temperature-dependent internal resistance ($R_i$) of a predeterminable current measuring coil (10) which can be connected to the input is arranged at the input (3).

6. Signal-processing circuit (1) according to claim 5, characterized in that the first passive integrating element (5) is formed as a low-pass filter comprising a first resistor ($R_1$), and in that the first resistor ($R_1$) is designed comprising the temperature compensation circuit (9).

7. Signal-processing circuit (1) according to claim 1, characterized in that the signal-processing circuit (1) has a voltage monitoring unit (11) which is connected to the input (3) and which is designed in such a way that it outputs a trigger signal when a predeterminable voltage occurs at the input (3).

8. Signal-processing circuit (1) according to claim 7, characterized in that the active integrator (6) is designed comprising a first operational amplifier (12) and a feedback capacitor ($C_3$), wherein the signal-processing circuit (1) further comprises an active regulating unit (13) which is connected to the feedback capacitor ($C_3$) and which is designed such that it regulates the voltage across the feedback capacitor ($C_3$) below a predeterminable value.

9. Signal-processing circuit (1) according to claim 8, characterized in that the voltage monitoring unit (11) is connected to an operating input (14) of the regulating unit (13), and in that the regulating unit (13) is designed in such a way that it switches off when the trigger signal is applied to the operating input (14).

10. Signal-processing circuit (1) according to claim 1, characterized in that the differentiating element (20) is designed as an active differentiator (8).

11. Signal-processing circuit (1) according to claim 1, characterized in that the active regulating unit (13) is designed such that it regulates the voltage across the feedback capacitor ($C_3$) essentially to zero.

* * * * *